United States Patent
Oda

Patent Number: 5,201,595
Date of Patent: Apr. 13, 1993

[54] ROLLED SHEET FEEDING MECHANISM OF PAPER-DRIVE TYPE AUTOMATIC DRAFTING MACHINE

[75] Inventor: Seiji Oda, Tokyo, Japan

[73] Assignee: Mutoh Industries Ltd., Tokyo, Japan

[21] Appl. No.: 834,786

[22] Filed: Feb. 13, 1992

[30] Foreign Application Priority Data

Mar. 25, 1991 [JP] Japan .................................. 3-83054

[51] Int. Cl.⁵ .......................................... B41J 15/16
[52] U.S. Cl. ..................................... 400/618; 226/195; 242/75.2; 346/139 R
[58] Field of Search .................... 226/195, 196, 198; 242/75.2, 75.3, 75; 400/613, 618; 346/139 R

[56] References Cited

U.S. PATENT DOCUMENTS

| | | | |
|---|---|---|---|
| 2,838,250 | 6/1958 | Stavrakis et al. | 242/75.2 X |
| 3,162,504 | 12/1964 | Pecknold | 346/139 R |
| 3,349,408 | 10/1967 | Gillen et al. | 346/139 R |
| 3,543,983 | 12/1970 | Littleton et al. | 226/195 |
| 3,997,095 | 12/1976 | Lamb | 242/75.2 X |
| 4,172,565 | 10/1979 | Zaffarano | 242/75.2 X |
| 4,463,918 | 8/1984 | Takagi | 242/75.2 X |
| 4,741,496 | 5/1988 | Mizutani et al. | 226/195 X |

Primary Examiner—Edgar S. Burr
Assistant Examiner—Christopher A. Bennett
Attorney, Agent, or Firm—Sughrue, Mion, Zinn, Macpeak & Seas

[57] ABSTRACT

A rolled paper supporting means 12 rotatably supporting a rolled paper is connected to a rotary drive system and arranged under a platen 2. In a paper sheet conveying route between the rolled paper supporting means 12 and the platen 2, pairs of tension rollers 20 and 24 are arranged leaving gaps a little larger than a thickness of the paper sheet. When a paper sheet passes through the gaps between these tension rollers 20 and 24, a weak braking force is given to the paper sheet in order to prevent the paper sheet from snaking. A sheet holding plate 29 is swingably arranged on the tension roller 24 of the pairs of tension rollers 20 and 24 so as to come in contact with and detached from the tension roller 24. The sheet holding plate 29 is pressed onto the tension roller 24 through a paper sheet on the tension roller 24 with a predetermined pressing force, preventing the paper sheet from being pulled in a reverse direction of the paper sheet conveying and feeding direction through the gaps of the pairs of tension rollers 20 and 24.

4 Claims, 5 Drawing Sheets (A)

(B)

FIG. 8(A)
PRIOR ART
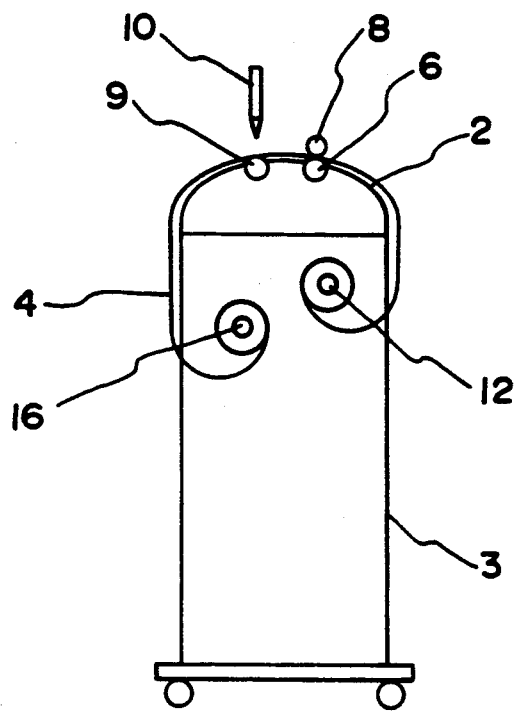
FIG. 8(B)
PRIOR ART
FIG. 8(C)
PRIOR ART
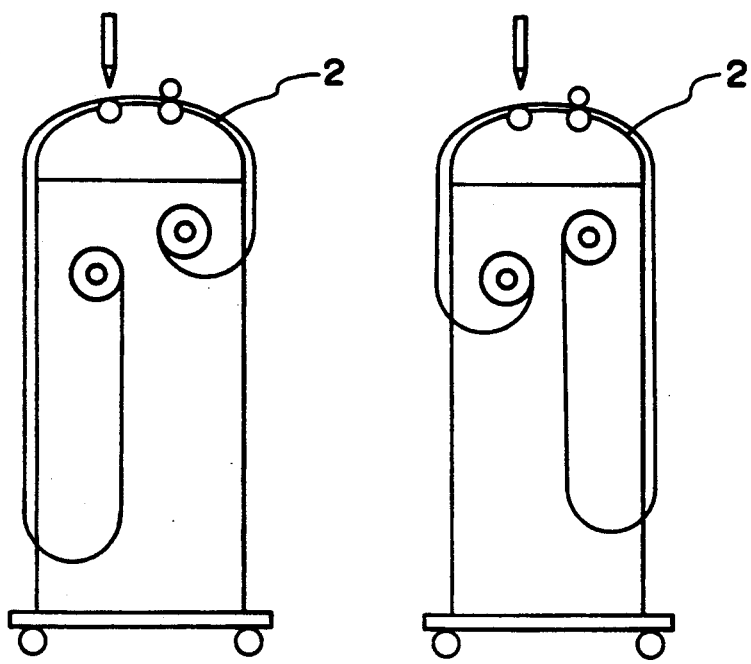

ROLLED SHEET FEEDING MECHANISM OF PAPER-DRIVE TYPE AUTOMATIC DRAFTING MACHINE

BACKGROUND OF THE INVENTION

The present invention relates to a paper-drive type automatic drafting machine used as a peripheral output apparatus of a computer of a CAD system and, in particular, to a rolled paper sheet feeding mechanism of such drafting machine.

According to the conventional drafting machine of this kind shown in FIG. 7 of the accompanying drawings, a rolled paper of a paper sheet 4 is rotatably held on a rolled paper holding means 12 placed below a platen 2 of the drafting machine.

When the conventional drafting machine carries out a drawing, it is necessary to perform a first step paper sheet paying-out operation which will be described below.

First, the operation arises from a condition of the rolled paper feeding mechanism, as shown in the prior art depicted in FIG. 8(A), in which the paper sheet 4, of the rolled paper is wound around a rolling means 16 such that a slack portion of the rolled paper does not exist below the rolled paper supporting means 12. Beginning with this condition, the drive roller 6 is driven counterclockwise, and the paper sheet 4 is paid out from the rolled paper onto the platen 2 and a part of the rolled paper supported on the supporting means 12, which corresponds to that of a drawing, is pulled out. As a result, part of the rolled paper is hung below the rolling means 16 as shown in FIG. 8(B).

Next, the drive roller 6 is driven to rotate in the reverse direction or clockwise by a number of rotations that equals that of the previous counterclockwise rotation such that a part of the paper sheet 4 is hung down below the rolled paper supporting means 12 as shown in FIG. 8(C).

After this paper sheet paying-out operation is performed, the drive roller 6 reversibly turns based on drawing data of a host computer and the paper sheet 4 is reciprocated in a front-and-rear direction on the platen 2, such that a writing instrument 10, while moving transversely acrossing the platen 2, controllably touches the paper sheet 4 on a drawing roller 9 in order to carry out a drawing operation.

After the drawing operation, the motor 18 is driven in order to roll up a drawn paper sheet 4 on the rolling means 16 finishing a whole operation of one drawing.

By repeating a series of steps starting from the sheet paying-out step, it is possible to continuously carry out drawings.

SUMMARY OF THE INVENTION

In the previously described sheet paying-out step of the automatic drafting machine, when a rotation of the drive roller 6 pays out a paper sheet 4 from the rolled paper on the rolled paper supporting means 12, large tension or shock is applied to the paper sheet 4, so that it is likely to produce a shift or displacement of the paper sheet 4 relative to the drive roller 6 deteriorating a conveying precision of the rolled paper 4.

Consequently, when two figures must be continuously drawn in two drawing ranges, lines passing through the border of these two ranges are disdvantageously sheared when drawing on the border.

It is possible to prevent a tension from generating in the paper, sheet 4 when it is paid out from the rolled paper by constructing a rolled paper feeding mechanism which connects the motor 18 to the rolled paper supporting means 12, the motor 18 drives the rolled paper supporting means 12 along its sheet supply direction to produce a slack under the rolled paper supporting means 12, where the slack portion of the paper sheet 4 is pulled-up on the platen by rotating the drive roller 6.

However, when rotating the drive roller 6 to pull up the paper sheet 4 on the platen 2 where no tension is present in the paper sheet 4, the paper sheet 4 is apt to be snaked and disadvantageously displaced out of the drive roller 6.

Accordingly, it is the purpose of the present invention to provide a rolled sheet feeding mechanism removing the above-mentioned problem.

According to the present invention, the paper sheet doesn't snake when pulled up to the platen of the automatic drafting machine from the rolled paper due to a rotation of the drive roller, thereby preventing a shear in the drawing when lines are drawn across a border of drawing ranges or frames of the paper sheet.

Further, according to the present invention, there is a rolled paper supporting means 12 for rotatably supporting the rolled paper below the platen 2 and the rolled paper supporting means 12 is arranged so as to be connected to a rotary drive system. A pair of tension rollers 20 and 24, respectively are arranged to leave a gap a little larger than a thickness of the sheet paper in a paper sheet conveying route from the rolled paper supporting means 12 to the platen 2. When a paper sheet passes through the gap between the pair of tension rollers 20 and 24, it is adapted to give a weak braking force to the travelling paper sheet preventing the paper sheet from snaking. One tension roller 24 of the pair of tension rollers has a sheet pressing plate 29 arranged near the tension roller 24 so as to come in contact with the roller 24 and be separated from it. In other words, the sheet pressing plate 29 is swingable. The sheet pressing plate 29 is ordinarily pressed onto the tension roller 24 through the paper sheet with a predetermined pressing force. Due to such pressing force, the paper sheet 4 can be prevented from being pulled into the gap between the pair of tension rollers 20 and 24 along a reverse directon of the paper sheet conveying direction.

In the sheet paying-out step, a drive system rotates the rolled paper supporting means 12 along a paper sheet feeding or supply direction so as to pay out a part of the paper sheet from the rolled paper the part paid out is used for one drawing where the part is hung below the rolled paper supporting means 12.

When the drive roller 6 rotates to pull up the paper sheet onto the platen 2 after the sheet paying-out step, the paper sheet 4 passes through the pair of tension rollers 20 and 24 when a weak braking force is given to the running paper sheet 4 from the tension rollers 20 and 24.

As a result of the weak tension supplied to the running paper sheet 4 by the pair of tension rollers 20 and 24, the running paper sheet 4 doesn't snake and is correctly supplied to the platen 2 by rotations of the drive roller 6.

When the slack part of the paper sheet is pulled up by force of the drive roller 6, the sheet pressing plate 29 swings a direction escaping the pressing force of the running paper sheet 4 and moves away from the tension roller 24. After being relieved from the of pulling-up of the paper sheet, the sheet pressing plate 29 returns to to apply a braking force to the running paper sheet 4.

In preparation of the next drawing operation, it is necessary to make the paper sheet accustomed to the surrounding air Accordingly, the rolled paper supporting means 12 is rotated along the paper sheet feeding direction by means of the drive system to produce slack in the paper sheet under the rolled paper supporting means 12 in a large scale. The operation of producing the slack in the paper sheet below the rolled paper supporting means 12 to acclimate the paper sheet to the air is called seasoning.

If, during the seasoning process, the sheet pressing plate 29 is not used, a weight of the slack in the long paper sheet would make the paper sheet between the tension rollers 20 and 24 and the platen 2 would slip down through the gap between the tension rollers in a direction as shown in FIG. 6. As a result, the slack portion of the paper sheet would disappear from the paper sheet between the platen 2 and the pair of tension rollers 20 and 24.

When the sheet pressing plate 29 of the present invention for pressing one tension roller 24 through the paper sheet is provided as described above, slipping-down of the slack portion of the paper sheet 4 between the platen 2 and the tension rollers is prevented.

According to the rolled paper feeding or supplying mechanism of the present invention constructed as described above, it is possible to prevent the paper sheet from snaking while the paper sheet is conveyed, as well as effectively preventing tension in the paper sheet from changing while drawing.

BRIEF DESCRIPTION OF THE DRAWINGS

FIG. 8 (A), (B), and (C), respectively are side elevations of the conventional paper sheet feeding mechanism.

DETAILED EXPLANATION OF THE INVENTION

The construction of the paper sheet feeding mechanism of the paper-drive type drafting machine, will be explained with reference to the embodiments shown in the accompanying drawings.

Figure 1:
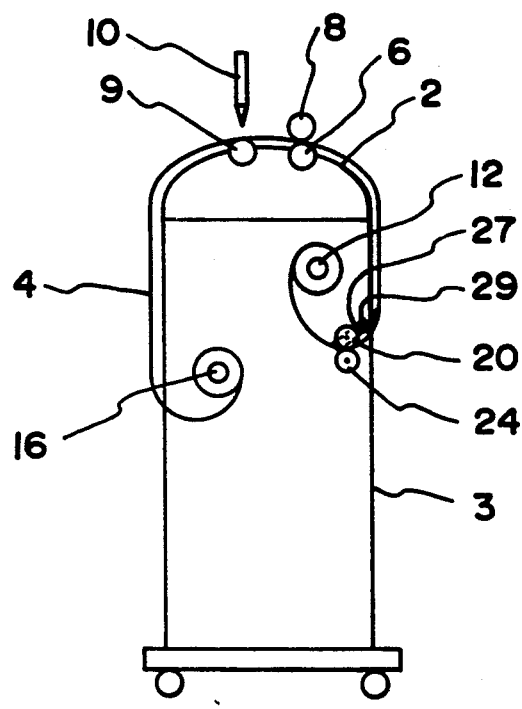
FIG. 1(A) and (B) respectively are side elevations depicting the paper sheet feeding mechanism of the paper-drive type automatic drafting machine according to the present invention.
Figure 1:
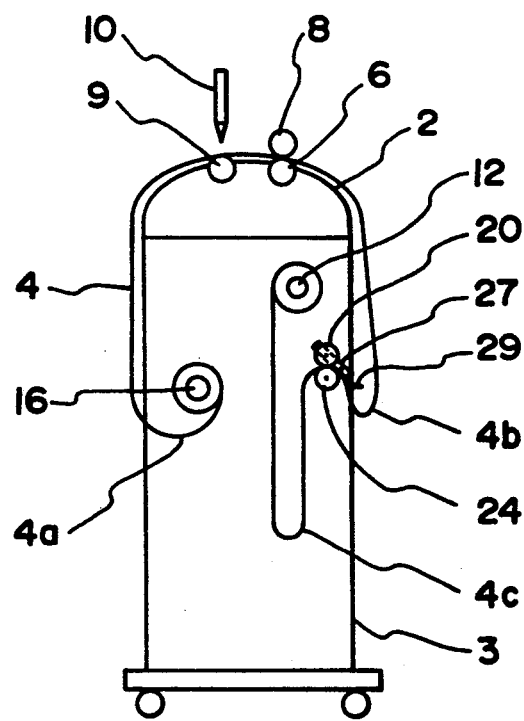

As shown in FIG. 1, a platen 2 is secured on a pair of leg plates 3 (only one leg plate is shown) of the paper sheet feeding mechanism. A drive roller 6 and a drawing roller 9 are connected to a drive system adapted to be controlled by a controller. The platen 2 has a Y-rail (not shown) extending in a vertical direction (Y-axis) with respect to the drawing sheet and is mounted on the platen 2. A writing instrument 10 is held by a drawing head (not shown) which is movably attached to the Y-rail.

A paper sheet 4 is pressed by a pressing roller 8. A rolled paper supporting means 12 is rotatably marked between the leg plates 3 and in a back space of the paper sheet feeding mechanism in order to detachably hold the rolled paper thereon.

Figure 5:
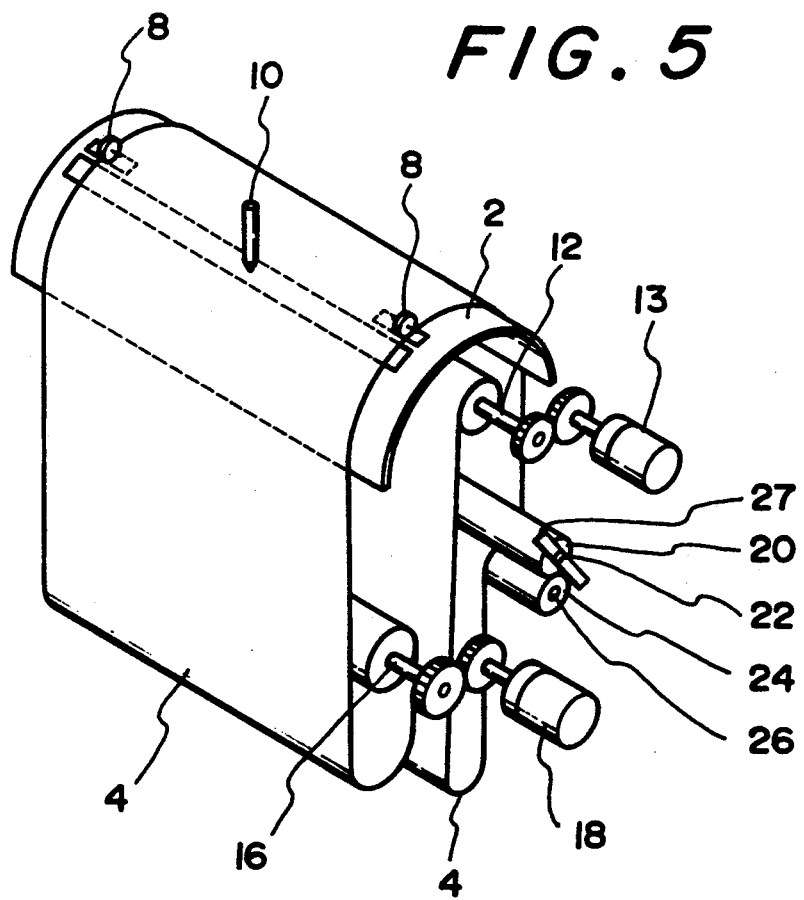
FIG. 5 is a perspective view of the whole construction of the paper sheet feeding mechanism.

A paper sheet rolling-up means 16 is placed in a front space of the paper sheet feeding mechanism and rotatably mounted between the leg plates 3. The rolled paper supporting means 12 and the rolling-up means 16 are connected to the output shafts of motors 13 and 18 (see FIG. 5) secured to the leg plate 3 and rotately and controllably driven by these motors 13 and 18.

A pair of tension rollers 20 and 24 are rotatably placed between the leg plates 3 and below the rolled paper supporting means 12. These tension rollers 20 and 24 are arranged to have a up-and-down direction gap between them a little larger than the thickness of the paper sheet 4.

The drawing roller 9, drive roller 6, rolled paper, and tension rollers 20, 24, respectively are arranged substantially parallel with each other. The tension rollers 20 and 24 may be rotatable or secured in their stationary condition. It is possible to arrange the tension rollers 20 and 24 in a up-and-down direction, right-and-left direction, or slanted condition.

The upper tension roller 20 of the pair of tension rollers has a pair of supporting shafts 22 provided at both of left and right ends of the upper tension roller 20. A pair of oscillating arms 27 are rotatably journalled with the supporting shafts 22. A long fixing plate 28 made of light and strong aluminum or synthetic resin is mounted on an oscillating side of the oscillating arm 27.

Figure 2:
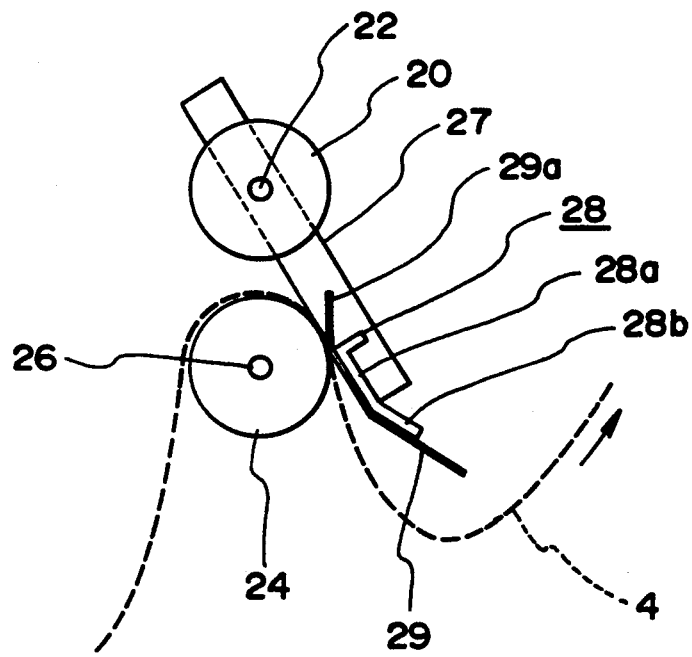
FIG. 2 is a side elevation of an important portion of the paper sheet feeding mechanism.

As shown in FIG. 2, a sheet pressing plate 29 made of a synthetic resin sheet {Rumirror (phonetic) of product name made of Tohre Co.,} is attached onto a flat plate portion 28a and a bent slanted portion 28b of the fixing plate 28.

Preferably, the material of the sheet pressing or holding plate 29 is tough, slippery, and minimizes electrical effects.

A front portion and rear portion 29a and 29b of the sheet pressing plate 29 protrude by a determined length from the front and back edges of the fixing plate 28. The protruded rear portion 29b of the sheet pressing plate 29 has a slant of about 20 degrees, so that when the paper sheet 4 is pulled up toward the platen 2 counterclockwise the rear portion 29b is pressed by the running paper sheet 4.

The reason for protruding the rear portion 29b of the sheet pressing plate 29 from a rear edge of the fixing plate 28 is to prevent the running paper sheet 4 from breaking by the fixing plate 28. The reason for slanting the rear portion 29b of the sheet pressing plate 29 counterclockwise is to allow an escape or evasion in pressure of the paper sheet 4, where the pressure is transferred to the rear edge of the sheet pressing plate 29 so as to prevent the running paper sheet 4 from being broken by the rear edge of the sheet pressing plate 29.

When the oscillating arm 27 rotates around the shaft 22 due to a weight of the oscillating arm 27, the sheet pressing plate 29 is adapted to come into forcible contact with an outer surface of the lower tension roller 24. The fixing plate 28 may be made of a square pipe or one flat plate.

Next, an operation of the embodiment of the rolled paper feeding mechanism of the present invention will be explained.

The paid-out part of the paper sheet 4 from the rolled paper supported on the rolled paper supporting means 12 passes between the tension rollers 20 and 24, over the rear upper portion of the platen 2, between the drive roller 6 and press roller 8, over the front upper portion of the platen 2, and finally around the rolling-up means 16.

As shown in FIG. 1(B), a drawing operation is carried out after slack parts of the paper sheet 4 are formed below the front and rear ends of the platen 2. These slack portion 4a and 4b of the paper sheet 4 prevent tension or stress from being produced in the paper sheet 4 while a drawing is being performed.

The slack part 4c of the paper sheet 4 placed inside of the rolled paper feeding mechanism from the tension rollers 20 and 24 is used to carry out seasoning for the slack part 4c, making the paper sheet part to be used for a next drawing accustomed to the surrounding air.

After a drawing for one frame is complete, the rolling-up means 16 rotates and a part of the paper sheet 4 for the completed drawing is rolled on the rolling-up means 16. Then, in order to prepare a next drawing operation, the drive roller 6 rotates and a slack part 4c of the paper sheet 4 is pulled up toward the platen 2. While this pulling-up step is performed, a relatively weak braking force is applied to the paper sheet 4 passing through the tension rollers 20 and 24, resulting in a weak tension being applied to the paper sheet 4 between the tension rollers 20, 24 and the drive roller 6.

Figure 3:
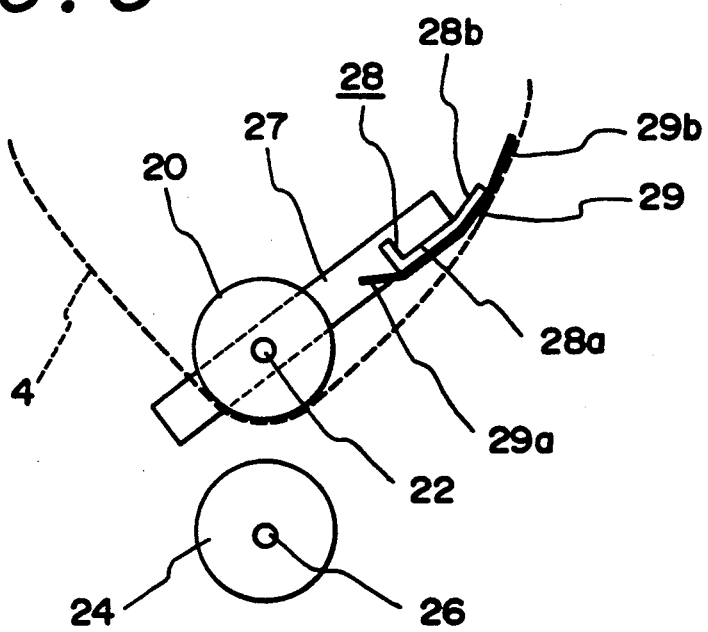
FIG. 3 is another side elevation of an important portion of the paper sheet feeding mechanism.
Figure 4:
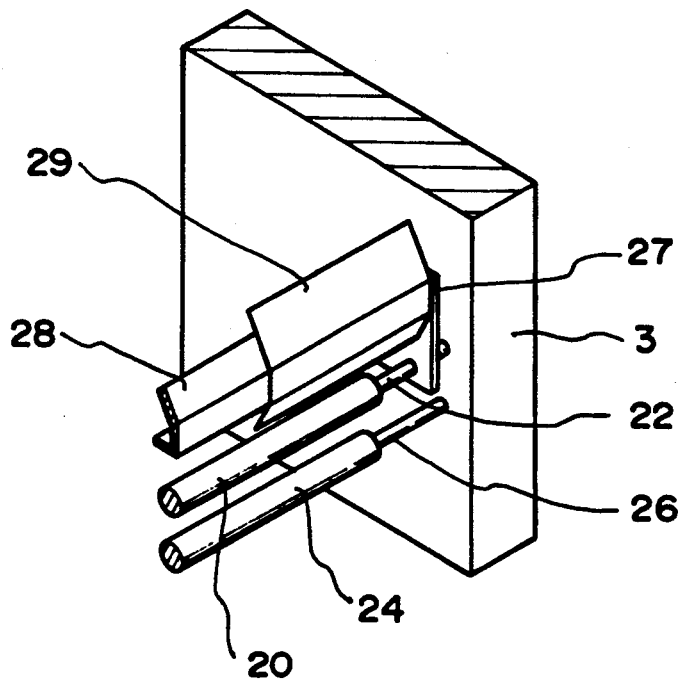
FIG. 4 is a still another side elevation of an important portion of the paper sheet feeding mechanism.

Due to such tension or stress, the paper sheet 4 is smoothly conveyed toward the platen 2 without a snaking in the paper sheet 4. The tension in the paper sheet 4 results in the fixing plate 28 being pulled-up as shown in FIG. 3 due to a counter-clockwise rotation of the oscillation arm 27 in order to evade tension of the paper sheet 4. Because of this escape operation in the fixing plate 28, the pressing force of the sheet pressing plate 29 applied to the paper sheet 4 does not result in undesirable tension being applied to the paper sheet 4.

When the automatic drafting machine is transferred to the next drawing stage, the slack portion 4b of the paper sheet 4 formed below a rear portion of the platen 2, the pressing force of the paper sheet 4 applied to the sheet pressing plate 29 is removed, thereby allowing the fixing plate 28 to drop or swing clockwise due to its weight around the shaft 22 as shown in FIG. 2. As a result, the sheet pressing plate 29 comes in contact with an outer surface of the lower tension roller 24 through the paper sheet 4.

This contact functions as a braking force preventing the paper sheet 4 from slipping along a surface of the lower tension roller 24. If no sheet pressing plate 29 were used and no braking force were applied to the paper sheet 4 running along the lower tension roller 24, the following problems would occur.

Figure 6:
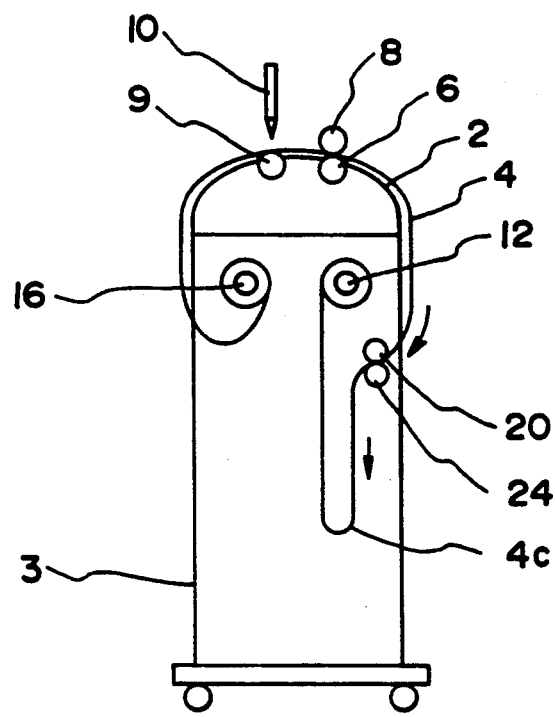
FIG. 6 is an explanatory side elevation showing the operation of the paper sheet feeding mechanism according to the invention.
Figure 7:
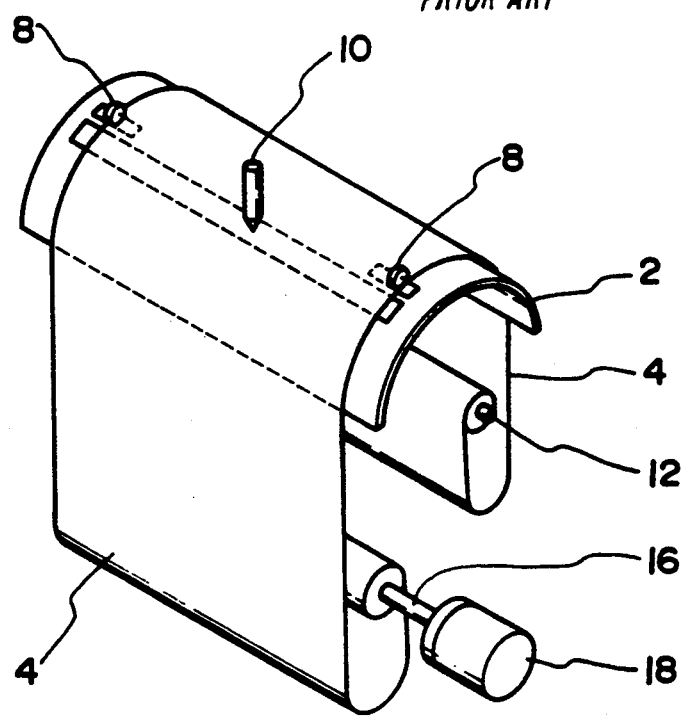
FIG. 7 is a perspective view of the conventional paper sheet feeding mechanism.

Given that the gap formed between the tension rollers 20 and 24 is a little wider than the thickness of the paper sheet 4, when a part of the paper sheet 4 is hung below the rolled paper supporting means 12, as shown in FIG. 6 to season the paper sheet 4, the weight of the slack part 4c of the paper sheet 4 would create a second upper slack portion of the paper sheet 4 between the tension rollers 20, 24 and a rear edge of the platen 2. This second upper slack portion would then slip through the gap of the tension rollers 20 and 24 and into the feeding mechanism at a left side of the tension rollers 20 and 24. The result is that the second upper slack portion of the paper sheet is absorbed into the lower slack part of the paper sheet 4. This same phenomena occurs when the respective tension rollers 20 and 24 are placed in a horizontal line.

As a result, in accordance with the foregoing, no slack portion of the paper sheet 4 is formed under the rear portion of the platen roller 2. Accordingly, when a drawing is finished and the drive roller 6 feeds the paper sheet 4 in a left direction on FIG. 6 along the upper surface of the platen 2, the paper sheet 4 is pulled-up through the tension rollers 20 and 24 with an undesirable tension or stress in an erroneous drawing operation. To prevent the foregoing condition, according to the present invention, the part of the paper sheet 4 under the rear portion of the platen 2 is held on the lower tension roller 24 by means of the sheet holding plate 29 with the slack part 4b. The part of the paper sheet 4 placed outside the the tension rollers 20 and 24 is not pulled into the inside of the tension rollers due to a weight of the fixing plate 28 and the pressing plate 29. Accordingly, a slack condition of the paper sheet 4 is retained between the tension rollers 20 and 24, and the platen 2 in a drawing.

What is claimed is:

1. In a rolled paper feeding mechanism of a paper-drive type automatic drafting machine, which mechanism comprises: pressing rollers, drive rollers, a platen, a pair of leg plates and rolled paper supporting means for storing paper sheets in rolled form on which a drawing operation is to be performed, the improvement comprising:

said platen secured on said pair of leg plates, said rolled paper supporting means rotatably mounted between said pair of leg plates and below said platen to feed said paper sheets to said platen and said pressing and drive rollers, first and second tension rollers both of which include a central axis secured to one of said pair of leg plates, said first and second tension rollers being provided in a paper sheet conveying route between the rolled paper supporting means and the platen with a gap therebetween, slightly larger than a thickness of the paper sheet, and a tension braking means having a predetermined weight for applying a braking force to the paper sheet passing through the gap, said tension braking means being secured to the central axis of the first tension roller to swingably face said second tension roller and press against said second tension roller with a predetermined force, through the paper sheet, in correspondence to the predetermined weight of said tension braking means.

2. The improvement according to claim 4, wherein said sheet holding plate is made of synthetic resin.

3. The improvement according to claim 1, wherein said tension braking means further comprises an oscillating arm placed at either side of the first tension roller so as to swing around the central axis of said first tension roller, a fixing plate mounted on an oscillating portion of the oscillating arm, and a sheet holding plate provided on the fixing plate so as to protrude from the fixing plate.

4. The improvement according to claim 3, wherein a front end of the sheet holding plate is bent in an upward direction to receive tension from the paper sheet.

* * * * *